US011531622B2

(12) United States Patent
Simionescu et al.

(10) Patent No.: US 11,531,622 B2
(45) Date of Patent: Dec. 20, 2022

(54) MANAGING DATA DEPENDENCIES FOR OUT OF ORDER PROCESSING IN A HYBRID DIMM

(71) Applicant: Micron Technology, Inc., Boise, ID (US)

(72) Inventors: Horia C. Simionescu, Foster City, CA (US); Chung Kuang Chin, Saratoga, CA (US); Paul Stonelake, San Jose, CA (US); Narasimhulu Dharanikumar Kotte, Milpitas, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 17/003,345

(22) Filed: Aug. 26, 2020

(65) Prior Publication Data
US 2021/0089450 A1    Mar. 25, 2021

Related U.S. Application Data

(60) Provisional application No. 62/903,377, filed on Sep. 20, 2019.

(51) Int. Cl.
G06F 12/084 (2016.01)
G06F 13/16 (2006.01)
G11C 14/00 (2006.01)

(52) U.S. Cl.
CPC ........ G06F 12/084 (2013.01); G06F 13/1668 (2013.01); *G06F 2212/604* (2013.01); *G11C 14/0018* (2013.01); *G11C 14/0045* (2013.01)

(58) Field of Classification Search
CPC .... G06F 9/3838; G06F 9/3855; G06F 12/084; G06F 13/1668; G06F 2212/604; G11C 14/0018; G11C 14/0045

(Continued)

(56) References Cited

U.S. PATENT DOCUMENTS 6,470,445 B1 * 10/2002 Arnold .................. G06F 9/3824
                                                           712/218
8,140,764 B2    3/2012 Shen et al.
(Continued)

FOREIGN PATENT DOCUMENTS

WO    2017052595 A1    3/2017

OTHER PUBLICATIONS

PCT Notification of Transmittal Of The International Search Report And The Written Opinion Of The International Searching Authority for PCT Application No. PCT/US2020/051634, dated Dec. 23, 2020, 11 pages.

(Continued)

*Primary Examiner* — Hashem Farrokh
(74) *Attorney, Agent, or Firm* — Lowenstein Sandler LLP

(57) ABSTRACT

Systems and methods are disclosed including a processing device operatively coupled to a first and a second memory device. The processing device can receive a set of data access requests, from a host system, in a first order and execute the set of data access requests in a second order. The processing device can further identify a late data access request of the set of data access requests and determine whether a data structure in a local memory associated with the processing device includes a previous outstanding data access request corresponding to an address associated with the late data access request. Responsive to determining that the data structure includes an indication of a previous outstanding data access request corresponding to the address associated with the late data access request, identifying a type of data dependency associated with the previous outstanding data access request and performing one or more operations associated with the type of data dependency.

18 Claims, 5 Drawing Sheets

(58) Field of Classification Search
USPC .......................................................... 711/105
See application file for complete search history.

(56) References Cited

U.S. PATENT DOCUMENTS

| | | | |
|---|---|---|---|
| 9,201,796 B2 | 12/2015 | Biswas et al. | |
| 9,292,294 B2 | 3/2016 | Al-Otoom et al. | |
| 10,019,196 B2 | 7/2018 | Zaltsman et al. | |
| 2003/0135713 A1* | 7/2003 | Rychlik | G06F 9/3013 |
| | | | 712/217 |
| 2004/0088479 A1 | 5/2004 | Hall | |
| 2004/0205300 A1 | 10/2004 | Bearden | |
| 2006/0026371 A1 | 2/2006 | Chrysos et al. | |
| 2006/0184740 A1 | 8/2006 | Ishikawa et al. | |
| 2008/0189452 A1 | 8/2008 | Merry et al. | |
| 2009/0100224 A1 | 4/2009 | Wang | |
| 2011/0153949 A1 | 6/2011 | Olszewski et al. | |
| 2013/0212319 A1* | 8/2013 | Hida | G06F 3/0659 |
| | | | 711/103 |
| 2014/0089600 A1 | 3/2014 | Biswas et al. | |
| 2014/0372668 A1 | 12/2014 | Yeh | |
| 2015/0081981 A1 | 3/2015 | McKean et al. | |
| 2016/0085639 A1 | 3/2016 | Abouzour et al. | |
| 2016/0092356 A1 | 3/2016 | Suman et al. | |
| 2016/0092359 A1 | 3/2016 | Busaba et al. | |
| 2016/0139828 A1 | 5/2016 | Yan et al. | |
| 2016/0170887 A1 | 6/2016 | Jafri et al. | |
| 2016/0299853 A1* | 10/2016 | Kauer | H04L 45/74591 |
| 2017/0103553 A1 | 4/2017 | Busayarat et al. | |
| 2017/0115891 A1 | 4/2017 | OKrafka et al. | |
| 2017/0371660 A1* | 12/2017 | Smith | G06F 9/3005 |
| 2018/0107595 A1 | 4/2018 | Jung | |
| 2018/0113629 A1 | 4/2018 | Kim et al. | |
| 2018/0365016 A1* | 12/2018 | Iuliano | G06F 9/3867 |
| 2019/0056953 A1* | 2/2019 | Hsu | G06F 9/3836 |
| 2019/0163394 A1* | 5/2019 | Loh | G06F 12/0888 |
| 2019/0171575 A1 | 6/2019 | Chen et al. | |
| 2020/0142702 A1* | 5/2020 | Fatehi | G06F 9/3824 |

OTHER PUBLICATIONS

PCT Notification of Transmittal Of The International Search Report And The Written Opinion Of The International Searching Authority for PCT Application No. PCT/US2020/051299, dated Dec. 23, 2020, 9 pages.

PCT Notification of Transmittal Of The International Search Report And The Written Opinion Of The International Searching Authority for PCT Application No. PCT/US2020/051391, dated Dec. 23, 2020, 12 pages.

* cited by examiner

MANAGING DATA DEPENDENCIES FOR OUT OF ORDER PROCESSING IN A HYBRID DIMM

RELATED APPLICATION

This application claims the benefit of U.S. Provisional Application No. 62/903,377, filed Sep. 20, 2019, the entire content of which is hereby incorporated by reference.

TECHNICAL FIELD

Embodiments of the disclosure generally relate to memory sub-systems, and more specifically, relate to managing data dependencies for out of order processing in a hybrid dual in-line memory module (DIMM).

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
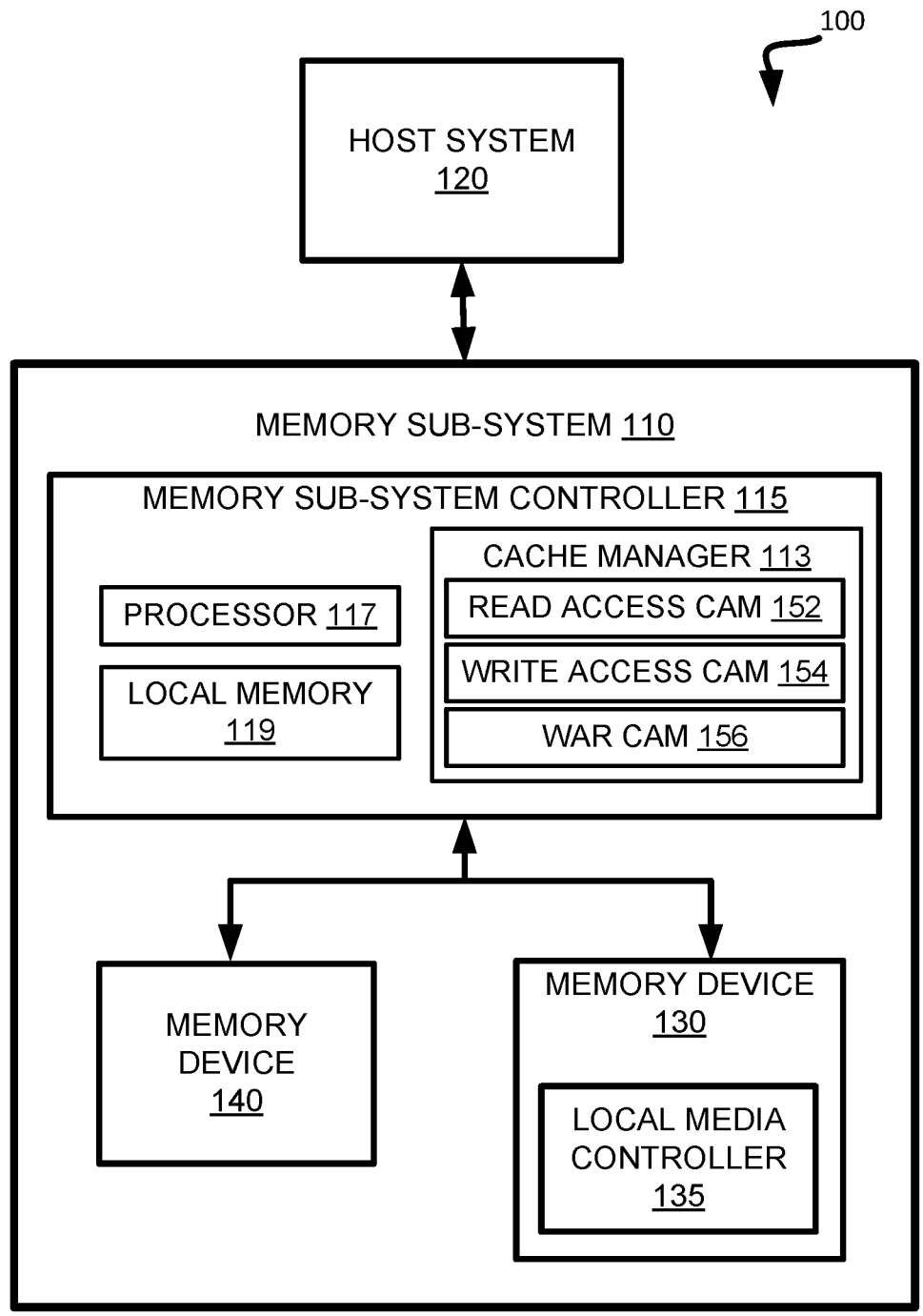
FIG. 1 illustrates an example computing system that includes a memory sub-system in accordance with some embodiments of the present disclosure.

Aspects of the present disclosure are directed to managing data dependencies for out of order processing in a hybrid dual in-line memory module. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include both non-volatile and volatile memory devices. One example of non-volatile memory devices is a negative-and (NAND) memory device. Another example is a three-dimensional cross-point ("3D cross-point") memory device, which is a cross-point array of non-volatile memory cells. Other examples of non-volatile memory devices are described below in conjunction with FIG. 1. A non-volatile memory device is a package of one or more dice. The dice in the packages can be assigned to one or more channels for communicating with a memory sub-system controller. Each die can include a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

The non-volatile memory devices can include three-dimensional cross-point ("3D cross-point") memory devices that are a cross-point array of non-volatile memory cells and can perform bit storage based on a change of bulk resistance, in conjunction with a stackable cross-gridded data access array. Additionally, in contrast to many flash-based memories, 3D cross-point memory devices can perform a write in-place operation, where a non-volatile memory cell can be programmed without the non-volatile memory cell being previously erased. Such non-volatile memory devices can group pages across dice and channels to form management units (MUs).

The memory sub-system can be a hybrid DIMM that includes a first type of a memory device (e.g., 3D cross-point media) and a second type of memory device (e.g., a dynamic random access memory (DRAM)) in a single DIMM package. The first type of memory device (i.e., a first memory type) can have a large storage capacity but a high access latency while the second type of memory device (i.e., a second memory type) has a smaller amount of volatile memory but a lower access latency. A cache manager can manage retrieval, storage, and delivery of data to and from the first type of memory device and the second type of memory device. Data transfers between the first type of a memory device (e.g., 3D cross-point) and the second type of a memory device (e.g., DRAM) require more time to process as compared to the processing speed of a cache manager processing a data access request (e.g., read access requests and write access requests) from a host system.

The cache manager allows the second type of memory to act as a cache for the first memory type. Thus, the high latency of the first memory type can be masked by the low latency of the second memory type if the cache hit rate is high. For example, a DRAM memory device, or other volatile memory, can be used as a cache memory for a 3D cross-point memory device, or other non-volatile memory device, such as storage class memory (SCM). The host system can utilize the hybrid DIMM to retrieve and store data at the 3D cross-point memory. The hybrid DIMM can be coupled with the host system by a bus interface (e.g., the DIMM connector). The DIMM connector can be a synchronous or an asynchronous interface between the hybrid DIMM and the host system. When the host system provides a data access request, such as a read access request, the corresponding data can be returned to the host system from the 3D cross-point memory or from another memory device of the hybrid DIMM that is a cache memory for the 3D cross-point memory.

In conventional memory systems, a host system can send a read access request and/or a write access request to the memory sub-system. These data access requests (e.g., read access requests and write access requests) can be queued and processed in the order received (e.g., first in, first out, hereafter "FIFO") by the memory sub-system to prevent issues related to data dependencies. Data dependency is a situation in which a data access request refers to data being operated on by a preceding data access request. For example, the memory sub-system controller can receive a write access request for data stored at a physical address, followed by a read access request for the data from the same physical address. If the read access request is performed prior to the write access request, the read access request will return incorrect data to the host system, as the write access request has not yet been processed. However, queuing and processing the data access requests in the order received can be undesirable, because not all data access requests have data dependencies and most data access requests can be issued and completed out of order. Completing data access requests out of order can reduce latency experienced by frequent switching between read and write operations, and by switching to a different block or die when outstanding data access requests to said block or die are still queued.

Aspects of the present disclosure address the above and other deficiencies by implementing a set of schemes to manage data dependencies. In an illustrative example, the second type of memory device (e.g., DRAM) can be structured as a cache that stores recently accessed, and/or highly accessed data so that such data can be accessed quickly by the host system. Read access requests and write access requests to data in a cache can generally be processed out of order (e.g., the memory sub-system need not process the first request received before the second request) unless there are data dependencies, such as when multiple data access requests correspond to the same data (e.g., data stored at the same physical address). Examples of data dependencies include read access request after write access request (RAW), write access request after read access request (WAR), and write access request after write access request (WAW). A write access content-addressable memory (CAM) can be used to track all outstanding write access requests before a data transfer for the write access requests is complete. A read access CAM can be used to track all outstanding read access requests, and a WAR CAM can be used to track all write access requests that have a read access request ahead of them. When a read access request or a write access request is received, a write CAM lookup can be performed by the cache manager to determine whether there are any outstanding write access requests to the same physical address prior to the newly received read access request or write access request. Additionally, for each write access request received, a read access CAM lookup can be performed to determine if any outstanding read access requests to the same physical address are to be performed prior to the new write access request. Responsive to determining that the write access CAM and/or the read access CAM include an indication of an outstanding data (read or write) access request corresponding to the address associated with the read or write access request received, the cache manager can determine which type of data dependency scenario exists and perform operations associated with the determined data dependency scenario. Depending on which type of data dependency scenario is detected, the cache manager can reorder the received data access request and/or the outstanding data access request accordingly.

Advantages of the present disclosure include, but are not limited to, an improved performance of the hybrid DIMM leading to a higher quality of service for the host system. For example, the caching operations between the first memory device and the second memory device can be internal to the hybrid DIMM. Thus, when data is transmitted from the 3D cross-point memory to be stored at the DRAM data cache, the transmitting of the data will not utilize an external bus or interface that is also used by the host system when receiving and transmitting write operations and read operations. In addition, the present disclosure allows read commands and write commands to be serviced by the cache manager out-of-order while still allowing any data dependencies to be maintained with minimal latency increase.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g. 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local controller 132) on the die and a controller (e.g., memory sub-system controller 115) for media management within the same memory device package. An example of a managed memory device is a managed NAND (MNAND) device.

In one embodiment, the memory sub-system 110 includes a cache manager 113 that can be used to track and manage data in the memory device 130 and the memory device 140, as well as data access commands (e.g., read access commands, write access commands, etc.) received from the host system 120. In some embodiments, the memory sub-system controller 115 includes at least a portion of the cache manager 113. In some embodiments, the cache manager 113 is part of the host system 120, an application, or an operating system. In other embodiments, local media controller 135 includes at least a portion of cache manager 113 and is configured to perform the functionality described herein. The cache manager 130 can communicate directly with the memory devices 130 and 140 via a synchronous interface. Furthermore, transfers of data between the memory device 130 and the memory device 140 can be done within the memory sub-system 110 without accessing the host system 120.

The memory device 140 can include a data cache that stores data from memory device 130 so that future requests for data can be served faster. A cache line is a basic unit for cache storage and can contain multiple bytes and/or words of data. A smaller cache line size has a higher hit rate but requires more tag memory than a large cache size line. A tag is a unique identifier for a group of data that can be used to differentiate different regions of mapped memory.

In some embodiments, all the data that is stored by the memory sub-system 110 can be stored at the memory device 130. Certain data that is stored at the memory device 130 can also be stored at the data cache of the memory device 140. For example, data that is determined to be more frequently, or more recently, accessed by the host system 120 can be stored at the data cache for faster host access. When the host system 120 provides a read access command for data stored at the data cache (i.e., a cache hit), the data can be retrieved from the data cache as opposed to being retrieved from the memory device 130. The bandwidth or capability of retrieving data at the data cache can be faster than the bandwidth or capability of retrieving data at the memory device 130.

The cache manager 113 can include executable code that implements one or more of the components and modules and can be implemented within the controller 115, hardware firmware, or a combination thereof. The cache manager 113 can include a read access content-addressable memory (CAM) 152, a write access CAM 154, and a write after read (WAR) CAM 156. A CAM is a special type of computer memory that can compare input search data (e.g., a tag) against a table of stored data, and return the address of matching data. In particular, data stored on a CAM can be accessed by searching the content itself, and the cache manager 113 can retrieve the addresses where that content is found.

The cache manager 113 can execute multiple read access requests and/or write access requests to data in a cache (e.g., memory device 140) out of order from one or more queues (e.g., FIFO queue), unless data dependencies exist. Read access requests can be queued in a read queue (e.g., read FIFO). Write access requests can be queued in a write queue (e.g., write FIFO). The cache manager 113 can select from either the read queue or the write queue for processing. Examples of data dependencies include, but are not limited to, a read access request after a write access request (hereafter "RAW"), a write access request after a read access request (hereafter "WAR"), and a write access request after an existing write access request (hereafter "WAW"). When such data dependencies occurs, they can be referred to as a data dependency scenario (e.g., a RAW scenario, a WAR scenario, and a WAW scenario).

The write access CAM 154 can include the write queue, and can track all outstanding write access requests stored in the write queue prior to a data transfer for a write access request being executed. A size of the write access CAM 154 can be determined by the total number of outstanding write access requests that can be supported by the cache. Each write access request can then be assigned a write access identification (WID). The cache manager 113 can use the write access CAM 154 to identify and address any read or write access requests that follow an outstanding write access request, as will be explained in greater detail below.

The read access CAM 152 can include a read queue, and can track all outstanding read access requests stored in the read queue. The read access CAM 152 can also track all outstanding read access requests in a data pipeline (e.g., between an order FIFO and a read FIFO). The order FIFO stores write requests and read requests in the order issued by the host. A data pipeline is a set of data processing elements connected in a series, where the output of one element is the input of the next element. A size of the read access CAM 152 can be determined by the total number of outstanding read access requests that can be supported by the cache. Each read access request can then be assigned a read access identification (RID).

The WAR CAM 156 can be used to track all write access requests that have a read access request ahead of them. A size of the WAR CAM can be determined by the total number of outstanding write access requests that can be supported by the cache.

The cache manager 113 can receive data access requests (read access requests and write access requests) from, for example, the host system 120. Responsive to receiving a data access request from the host system 120, the cache manager 113 can perform a lookup in the write access CAM 154 to determine whether a physical address being accessed by the data access request has an outstanding write access request. If the write access CAM 154 lookup is a hit and the data access request is a read access request (e.g., a RAW scenario), the cache manager 113 can execute the write access request prior to executing the read access request. If the write access CAM 154 lookup is a hit and the data access request is a write access request (e.g., a WAW scenario), then the WID of the write access CAM 154 lookup hit can be stored in a separate hit WID queue and disregarded rather than executed. In some embodiments, responsive to the write access CAM 154 lookup being a hit or a miss, the WID can be written into the write access CAM 154 to become an outstanding write access request, and a miss indication can also be stored in the hit WID queue.

It is noted that the miss indication can be used because the write access address and write access data can be sent at different times with write access data coming a few clock cycles after the write access address. The write access data can go through an error checking process with error checking information being stored in an error check queue. The write access request can be nullified with a data error, and the cache manager 113 can use the stored error checking information in the error check queue to remove the hit WID (associated with the write access request) for a write access CAM 154 lookup hit. The cache manager 113 can remove the outstanding write access request stored in the write access CAM 154 once the transfer for the write access request is executed, as indicated by releasing its WID. When an outstanding write access request is being removed from the write access CAM 154, no write access CAM 154 lookup is performed. This implies that a read access request or a write access request in a cache queue can be happen at least one cycle earlier than when the hit WID is selected for processing by the cache manager 113. In another example, the cache manager 113 execute a write access CAM 154 lookup even when the write access request is being invalidated. This implies that the write access CAM 154 lookup delay can be less than or equal to write cache lookup delay.

In a RAW scenario, responsive to a write access CAM 154 lookup hit from a read access request, the cache manager 113 can use data of the write access request in a write buffer to service the read access request. The cache lookup for a read access request associated with the write CAM lookup hit can be nullified by the cache manager 113. The cache manager 113 can transfer data from the write buffer (where the data of all write access requests are stored) to the read buffer (where the data of all read access requests are stored before being read by the host system 120) once the write access CAM 154 lookup hit occurs. The cache manager 113 can recycle (or release) the hit WID from the write access CAM 154 after the write access request is executed. It is noted that the execution of the write access request can take longer than the execution of the read access request.

In some embodiments of a RAW scenario, the cache manager 113 sends to the write buffer the hit WID so that the cache manager 113 knows which location to read. The cache manager 113 can also send RID to the write buffer so that the RID and the write buffer data read can be sent to the host system 120 together. The cache manager 113 can use a FIFO queue to indicate whether a read access request is a hit or miss (by looking up write access CAM 154). Responsive to a hit, when the read access request is serviced by the cache manager 113, the read access request will be discarded because it has already been sent to the write buffer.

For a write access request following a write access request (WAW scenario), the cache manager 113 can set a delete flag for a hit WID. When a write access request is serviced by the cache manager 113, the cache manager 113 can check if the associated delete flag is set. If set, the hit WID will be released. The cache manager 113 can also check if the write access request is associated with the hit WID. If so, the cache manager 113 will clear the delete flag of the hit WID. Additionally, the cache manager 113 can send, to a write buffer, a read access request following a write access request to the same physical address until the previous write access request is executed. For example, when a RAW scenario occurs, the cache manager 113 can retrieve the data of the write access CAM 154 lookup hit, and return the data of the hit write access request in the write buffer for the read access request. Because the data of the write access request can be the current data, retrieval from the write buffer provides the correct data with a quicker access time. The data can be moved from the write buffer to the read buffer after the write CAM 154 hit occurs so that the data can be quickly read before the write access request is executed. When a WAW scenario occurs, the cache manager 113 can delete the write access request in the write access CAM 154 that is hit. The new write access request can have the most current version of the data and, therefore, the cache manager 113 can disregard the pervious outstanding write access request.

In an embodiment, when the cache manager 113 reads a WID in the write queue without an error indication, the cache manager 113 can set a delete WID flag in a delete WID table at a location indexed by the hit WID. When the data transfer for the hit WID write access request is about to happen, the flag can be checked. If the delete WID flag is set, the cache manager 113 can nullify the data transfer and release the WID. Responsive to the cache manager 113 executing a write access request, the cache manager 113 can clearing the delete WID flag associated with the write access request.

The cache manager 113 can perform a lookup in the read access CAM 152 for all write access requests that are received to determine whether a write access request is accessing the same physical address as any outstanding read access requests (e.g., a WAR scenario). If the write access request has a read access CAM 152 lookup hit, the write access request can be stored in the read queue and the write queue together with a hit indication. The hit indication can prevent the write access request from overtaking the outstanding read access request from which it depends. The write access request can also be stored in the WAR CAM 156 so the next write access request with the same physical address can be stored in the read queue when its WAR CAM 156 lookup is a hit. A write access request with a WAR CAM 156 lookup hit can also replace the entry in the WAR CAM 156 that was hit.

In some embodiments, a write access request from the write queue can only be selected for processing by the cache manager 113 when its write data error status is available. However, the write access request associated with a WAR CAM 156 lookup hit may not be selected for cache manager 113 processing, but its error status can be stored in a WAR queue. The write access request out of the read queue may not be selected for cache manager 113 processing, either. Instead, the read access request can be stored into another WAR queue. When both WAR queue have data available, the cache manager 113 can select the write access request for processing.

Figure 2:
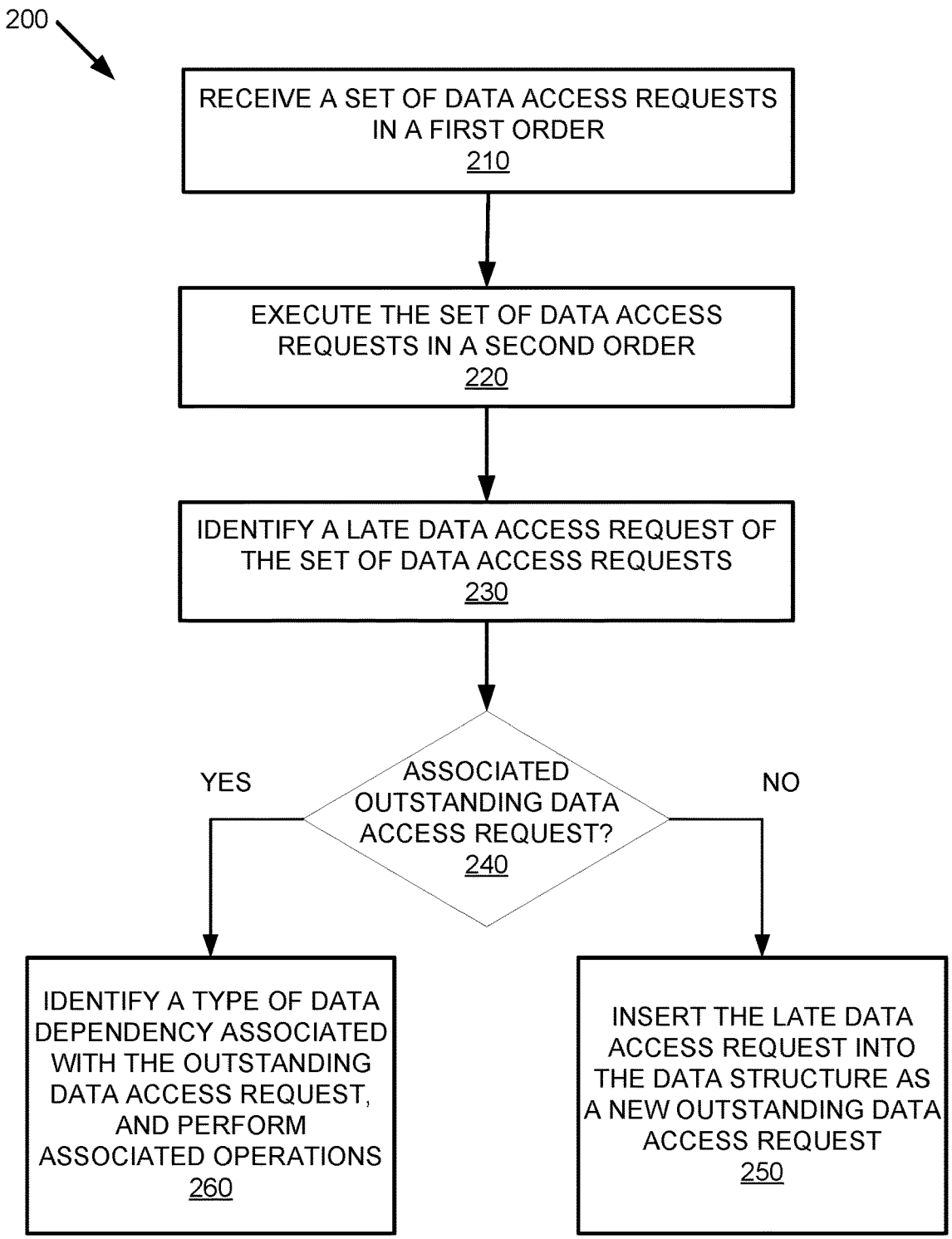
FIG. 2 is a flow diagram of an example method for performing operations in response to detecting a data dependency scenario, in accordance with some embodiments of the present disclosure.

FIG. 2 is a flow diagram of an example method 200 illustrating processes performed in response to detecting a data dependency scenario, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the cache manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing logic can receive a set of data access requests in a first order. The data access requests can include one or more read access requests, one or more write access requests, or any combination thereof. The first order can be a consecutive order and corresponds to the times at which the various requests in the set of data access requests are received by memory sub-system 110. For example in the first order, a first data access request can be received at a first time, and a second data access request can be received at a second time, wherein the second time occurs after the first time. In one embodiment, the set of data access requests are received at memory sub-system 110 from a host system, such as host system 120. In another embodiment, the set of data access requests includes one or more requests pertaining to memory management operations (e.g., garbage collection, wear leveling, etc.) that are generated within memory sub-system 110, such as by memory sub-system controller 115, or some other component.

At operation 220, the processing logic can execute the set of data access requests in a second order. The second order can be a non-consecutive order. For example, the processing logic can execute the set in a LIFO order (last-in, first out), can execute read access requests first, can execute the write access requests first, etc. Thus, even though the second request in the set of data access requests was received after the first request, as described above, in one embodiment, the second request can be processed before the first request is processed. In another embodiment, the second order is the same as the first order.

At operation 230, the processing logic can identify a late data access request of the set of data access requests. The late data access request can be any data access request that is not the first data access request received in the set of data access requests. For example, if the set of data access requests includes multiple data access requests, where the first data access request includes the first data access request received in the first order, any of a second, third, fourth, etc. data access requests received in the first order can be considered to be a late data access request.

At operation 240, the processing logic can determine whether a data structure in a local memory associated with the processing device includes an indication of a previous outstanding data access request corresponding to a physical address associated with the late data access request. The data structure can be at least one of the read access CAM 152, the write access CAM 154, the WAR CAM 156, or any combination thereof. In an example, the processing logic can perform a lookup of at least one of the read access CAM 152, the write access CAM 154, or the WAR CAM 156 to determine whether a physical address being accessed by the data access request has an outstanding data access request. For example, the data structure can have a number of entries, each corresponding to a previous outstanding data access request, and each having an associated physical address. In one embodiment, cache manager 113 can compare the physical address of the late data access request to the physical addresses associated with each entry in the data structure. Cache manager 113 can determine that the physical address of the late data access request has an outstanding data access request when the physical address of the late data access request matches the physical address associated with at least one of the entries in the data structure.

At operation 250, the processing logic can, responsive to determining that the data structure does not include the previous outstanding data access request, insert the late data access request into the data structure as a new outstanding data access request. For example, the late data access request can be placed into one or more of the CAM 152, the write access CAM 154, the WAR CAM 156, or any combination thereof.

At operation 260, the processing logic can, responsive to determining that the data structure includes the previous outstanding data access request, identify a type of data dependency (e.g., data dependency scenario) associated with the previous outstanding data access request and perform one or more operations associated with the type of data dependency. The data dependency scenario can include a RAW scenario, a WAW scenario, or a WAR scenario. A RAW scenario occurs when the late data access request is a read access request, and the outstanding data access request is a write access request. A WAW scenario occurs when the late data access request is a write access request, and the outstanding data access request is a write access request. A WAR scenario occurs when the late data access request is a write access request, and the outstanding data access request is a read access request.

Depending on which type of data dependency scenario is detected, the processing logic can reorder the late data access request and/or the outstanding data access request accordingly. In the event of a WAR scenario, the processing logic can place the late data access request in a queue to be executed after the previous outstanding data access request. In the event of a RAW scenario, the processing logic can execute the late data access request by reading data, from the data structure, associated with the previous outstanding data access request prior to executing the late read access request. In the event of a WAW scenario, the processing logic can delete the previous outstanding data access request and insert the late data access request into the data structure as a new outstanding data access request.

Figure 3:
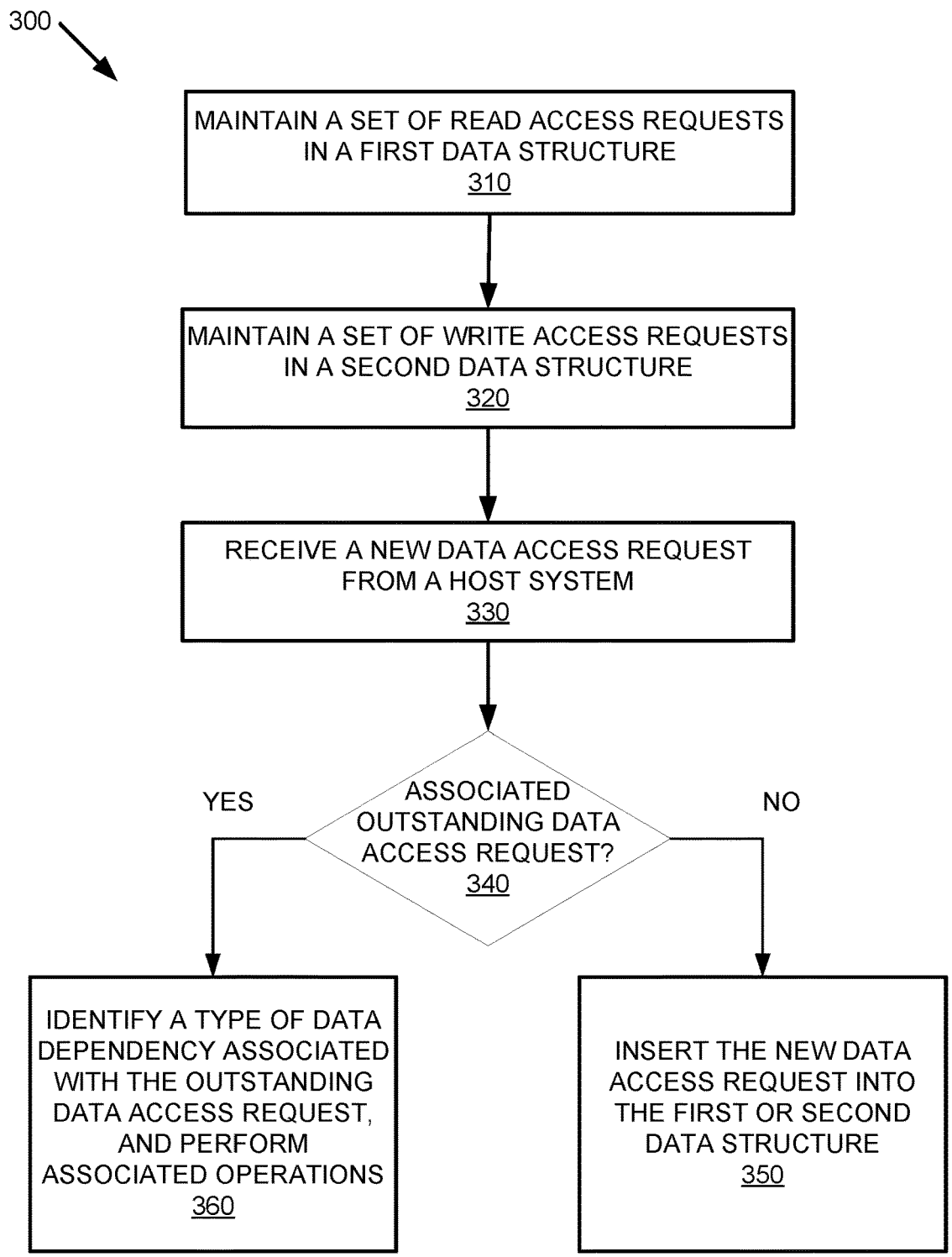
FIG. 3 is a flow diagram of another example method for performing operations in response to detecting a data dependency scenario, in accordance with some embodiments of the present disclosure.

FIG. 3 is a flow diagram of an example method 300 illustrating processes performed in response to detecting a data dependency scenario, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the cache manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing logic can maintain a set of read access requests in a first data structure. In an example, the first data structure can be the read access CAM 152. At operation 320, the processing logic can maintain a set of write access requests in a second data structure. In an example, the second data structure can be a write access CAM 154. The set of read requests and the set of write requests can be maintained in a first order in the read access CAM 152 and the write access CAM 154, respectively. The first order can be a consecutive order and corresponds to the times at which the various data access requests are received by memory sub-system 110. For example in the first order, a first data access request can be received at a first time, and a second data access request can be received at a second time, wherein the second time occurs after the first time. In one embodiment, the set of data access requests are received at memory sub-system 110 from a host system, such as host system 120. In another embodiment, the set of data access requests includes one or more requests pertaining to memory management operations (e.g., garbage collection, wear leveling, etc.) that are generated within memory sub-system 110, such as by memory sub-system controller 115, or some other component.

The processing logic can execute the set of read access requests and the set of write access requests in a second order. The second order can be a non-consecutive order. For example, the processing logic can execute the set in a LIFO order (last-in, first out), can execute read access requests first, can execute the write access requests first, etc. Thus, even though the second request in the set of data access requests was received after the first request, as described above, in one embodiment, the second request can be processed before the first request is processed. In another embodiment, the second order is the same as the first order.

At operation 330, the processing logic can receive, from the host system 120, a new data access request. The new data access request can be a read access request or a write access request. The new data access request can be any data access request that is not the first data access request in the set of read access requests in a first data structure, or in the write access requests in the second data structure. For example, if the set of data access requests in the first data structure and/or the second data structure includes multiple data access requests, where the first data access request includes the first data access request received in the first order, any of a second, third, fourth, etc. data access requests received in the first order can be considered to be a new data access request.

At operation 340, the processing logic can determine whether an outstanding data access request corresponding to an address associated with the new data access request is queued in at least one of the first data structure or the second data structure. For example, the processing logic can perform a perform a lookup of at least one of the read access CAM 152 or the write access CAM 154 to determine whether a physical address being accessed by the data access request has an outstanding data access request. For example, the first data structure and the second stat structure can have a number of entries, each corresponding to a previous outstanding data access request, and each having an associated physical address. In one embodiment, cache manager 113 can compare the physical address of the new data access request to the physical addresses associated with each entry in the first data structure and/or the second data structure. The cache manager 113 can determine that the physical address of the new data access request has an outstanding data access request when the physical address of the new data access request matches the physical address associated with at least one of the entries in the first data structure or the second data structure.

At operation 350, responsive to determining that the first data structure and the second data structure do not include the outstanding data access request, the processing logic can insert the new data access request into the first data structure when the new data access request is a read access request, or insert the new data access request into the second data structure when the new data access request is a write access request.

At operation 360, responsive to determining that the first data structure and/or the second data structure include the outstanding data access request, the processing logic can identify a type of data dependency (e.g., data dependency scenario) associated with the outstanding data access request and perform one or more operations associated with the type of data dependency. The data dependency scenario can include a RAW scenario, a WAW scenario, or a WAR scenario. A RAW scenario occurs when the new data access request is a read access request, and the outstanding data access request is a write access request. A WAW scenario occurs when the new data access request is a write access request, and the outstanding data access request is a write access request. A WAR scenario occurs when the new data access request is a write access request, and the outstanding data access request is a read access request.

Depending on which type of data dependency scenario is detected, the processing logic can reorder the new data access request and/or the outstanding data access request accordingly. In certain embodiments, responsive to determining the new data access request is a write access request and to detecting the outstanding data access request in the first data structure, the processing logic can place the new data access request in a queue to be executed after the outstanding data access request. Responsive to determining the new data access request is a read access request and to detecting the outstanding data access request in the second data structure, the processing logic can execute the new data access request by reading data, from the second data structure, associated with the outstanding data access request prior to executing the new read access request. Responsive to determining the new data access request is a write access request and to detecting the outstanding data access request in the second data structure, the processing logic can delete the outstanding data access request and inserting the new data access request into the second data structure as a new outstanding data access request.

Figure 4:
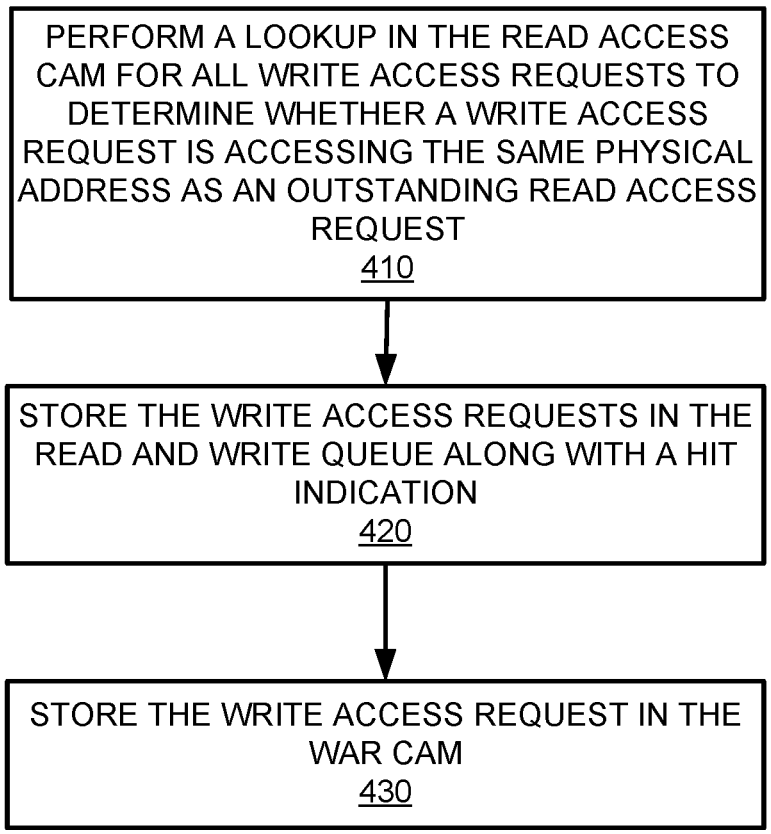
FIG. 4 is a flow diagram of an example method for performing operations in response to detecting write after read scenario, in accordance with some embodiments of the present disclosure.

FIG. 4 is a flow diagram of an example method 400 illustrating processes performed in response to detecting WAR scenario, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the cache manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic can perform a lookup in the read access CAM 152 for all write access requests that are received to determine whether a write access request is accessing the same physical address as any outstanding read access requests. Responsive to a write access request having a read access CAM 152 lookup hit, at operation 420, the processing logic can store the write access request in the read queue of the read CAM 152 and in the write queue of the write CAM 154 along with a hit indication. The hit indication can prevent the write access request from overtaking the outstanding read access request from which it depends.

At operation 430, the processing logic can store the write access request in the WAR CAM 156. The enables a next write access request with the same physical address to be stored in the read queue when its WAR CAM 156 lookup is a hit. The processing logic can also replace the entry in the WAR CAM 156 that was hit with the write access request associated with the WAR CAM 156 lookup hit.

Figure 5:
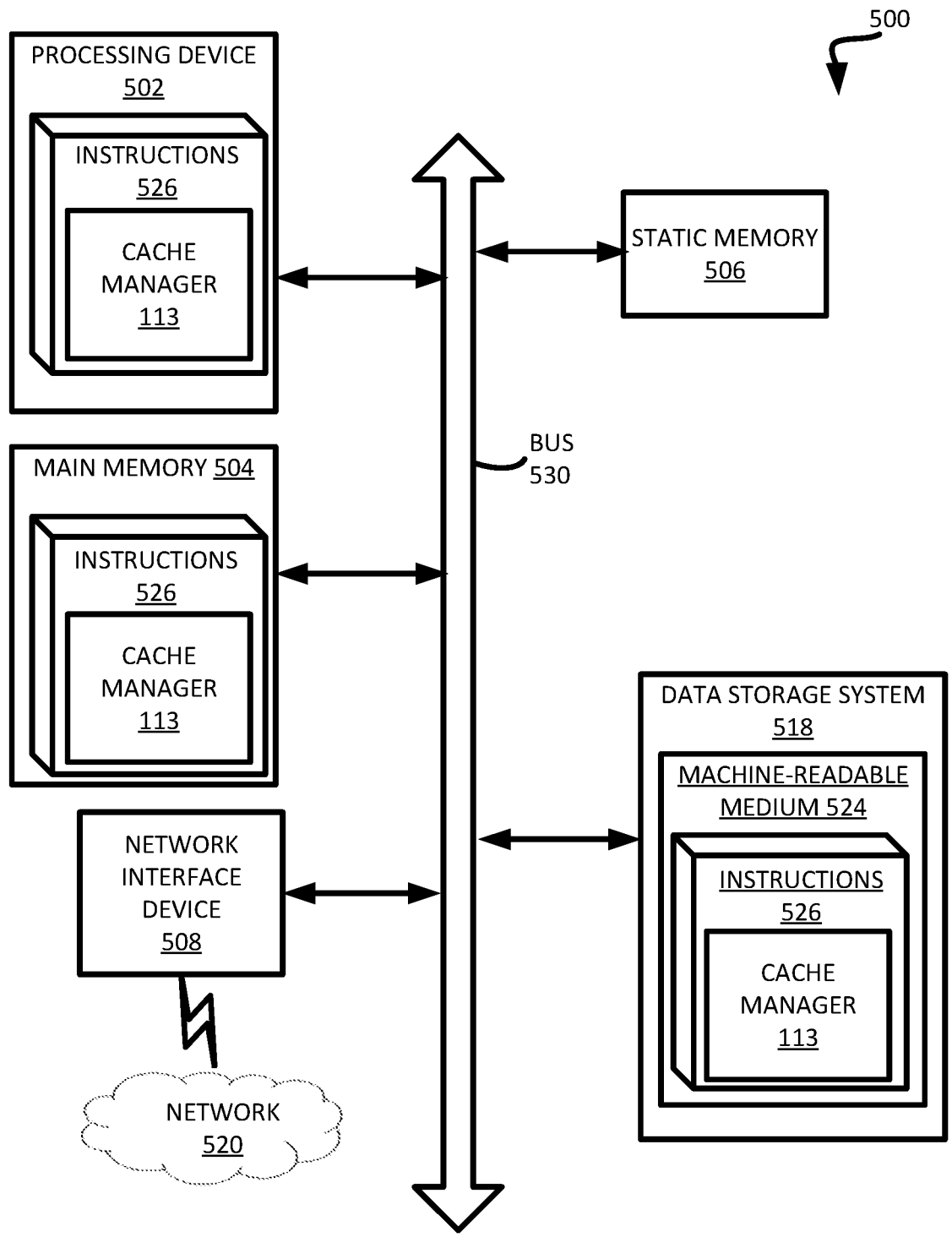
FIG. 5 is a block diagram of an example computer system in which embodiments of the present disclosure can operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes or utilizes a memory sub-system (e.g., the memory sub-system 110 of FIG. 1) or can be used to perform the operations of a controller (e.g., to execute an operating system to perform operations corresponding to cache manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530. Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to cache manager 113 of FIG. 1. While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a first memory device;
   a second memory device coupled to the first memory device, wherein the second memory device has a lower access latency than the first memory device and is used as a cache for the first memory device; and
   a memory sub-system controller comprising a processing device, and a first content-addressable memory (CAM), and a second CAM, wherein the processing device is operatively coupled to the first and second memory devices and configured to perform operations comprising:
   receiving a set of data access requests in a first order;
   executing the set of data access requests in a second order;
   responsive to identifying a late data access request of the set of data access requests, determining whether at least one of the first CAM or the second CAM includes an indication of a previous outstanding data access request corresponding to an address associated with the late data access request, wherein the first CAM stores write access requests and the second CAM stores read access requests; and
   responsive to determining that at least one of the first CAM or the second CAM includes an indication of a previous outstanding data access request corresponding to the address associated with the late data access request, identifying a type of data dependency associated with the previous outstanding data access request and performing one or more operations associated with the type of data dependency.

2. The system of claim 1, wherein the processing device to perform further operations comprising:
   responsive to determining that the late data access request is a read access request and that the previous outstanding data access request is a write access request, identifying a read after write (RAW) data dependency;
   responsive to determining that the late data access request is a write access request and that the previous outstanding data access request is a write access request, identifying a write after write (WAW) data dependency; and
   responsive to determining that the late data access request is a write access request and that the previous outstanding data access request is a read access request, identifying a write after read (WAR) data dependency.

3. The system of claim 2, wherein responsive to identifying the RAW data dependency, performing the one or more operations comprises executing the late data access request by reading data, from the CAM, associated with the previous outstanding data access request.

4. The system of claim 2, wherein responsive to identifying the WAW data dependency, performing the one or more operations comprises deleting the previous outstanding data access request and inserting the late data access request into the CAM as a new outstanding data access request.

5. The system of claim 2, wherein responsive to identifying the WAR data dependency, performing the one or more operations comprises placing the late data access request in a queue to be executed after the previous outstanding data access request.

6. The system of claim 1, wherein the processing device to perform further operations comprising:
   responsive to determining that the CAM does not include the indication of the previous outstanding data access request, inserting the indication of the late data access request into the CAM as a new outstanding data access request.

7. A method comprising:
   maintaining a set of read access requests in a first content-addressable memory (CAM);
   maintaining a set of write access requests in a second CAM;
   receiving a new data access request;
   determining whether an outstanding data access request corresponding to an address associated with the new data access request is queued in at least one of the first CAM or the second CAM; and
   responsive to determining that the first CAM and the second CAM include an indication of an outstanding data access request, identifying a type of data dependency associated with the outstanding data access request and performing one or more operations associated with the type of data dependency.

8. The method of claim 7, further comprising:
   responsive to determining that the new data access request is a read access request and that the outstanding data access request is a write access request, identifying a read after write (RAW) data dependency;
   responsive to determining that the new data access request is a write access request and that the outstanding data access request is a write access request, identifying a write after write (WAW) data dependency; and
   responsive to determining that the new data access request is a write access request and that the outstanding data access request is a read access request, identifying a write after read (WAR) data dependency.

9. The method of claim 8, wherein responsive to identifying the RAW data dependency, performing the one or more operations comprises executing the new data access request by reading data, from a CAM, associated with the outstanding data access request.

10. The method of claim 8, wherein responsive to identifying the WAW data dependency, performing the one or more operations comprises deleting the outstanding data access request and inserting the new data access request into the second CAM as a new outstanding data access request.

11. The method of claim 8, wherein responsive to identifying the WAR data dependency, performing the one or more operations comprises placing the new data access request in a queue to be executed after the outstanding data access request.

12. The method of claim 7, further comprising:
responsive to determining that the CAM does not include the indication of the previous outstanding data access request, inserting the indication of the new data access request into the CAM as a new outstanding data access request.

13. A non-transitory computer-readable storage medium comprising instructions that, when executed by a processing device operatively coupled to a first memory device and a second memory device, performs operations comprising:
receiving a set of data access requests in a first order;
executing the set of data access requests in a second order;
responsive to identifying a late data access request of the set of data access requests, determining whether at least one of a first content-addressable memory (CAM) in a local memory associated with the processing device or a second CAM in the local memory includes an indication of a previous outstanding data access request corresponding to an address associated with the late data access request, wherein the first CAM stores write access requests and the second CAM stores read access requests; and
responsive to determining that at least one of the first CAM or the second CAM includes an indication of a previous outstanding data access request corresponding to the address associated with the late data access request, identifying a type of data dependency associated with the previous outstanding data access request and performing one or more operations associated with the type of data dependency.

14. The non-transitory computer-readable storage medium of claim 13, wherein the processing device to perform further operations comprising:
responsive to determining that the late data access request is a read access request and that the previous outstanding data access request is a write access request, identifying a read after write (RAW) data dependency;
responsive to determining that the late data access request is a write access request and that the previous outstanding data access request is a write access request, identifying a write after write (WAW) data dependency; and
responsive to determining that the late data access request is a write access request and that the previous outstanding data access request is a read access request, identifying a write after read (WAR) data dependency.

15. The non-transitory computer-readable storage medium of claim 14, wherein responsive to identifying the RAW data dependency, performing the one or more operations comprises executing the late data access request by reading data, from the CAM, associated with the previous outstanding data access request.

16. The non-transitory computer-readable storage medium of claim 15, wherein responsive to identifying the WAW data dependency, performing the one or more operations comprises deleting the previous outstanding data access request and inserting the late data access request into the CAM as a new outstanding data access request.

17. The non-transitory computer-readable storage medium of claim 14, wherein responsive to identifying the WAR data dependency, performing the one or more operations comprises placing the late data access request in a queue to be executed after the previous outstanding data access request.

18. The non-transitory computer-readable storage medium of claim 14, wherein the processing device to perform further operations comprising:
responsive to determining that the CAM does not include the indication of the previous outstanding data access request, inserting the indication of the late data access request into the CAM as a new outstanding data access request.

* * * * *